US011715754B2

(12) United States Patent
Zeng et al.

(10) Patent No.: US 11,715,754 B2
(45) Date of Patent: Aug. 1, 2023

(54) SEMICONDUCTOR PACKAGE WITH TSV INDUCTOR

(71) Applicant: MEDIATEK INC., Hsin-Chu (TW)

(72) Inventors: Zheng Zeng, San Jose, CA (US);
Ching-Chung Ko, Hsinchu (TW);
Kuei-Ti Chan, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 17/319,078

(22) Filed: May 12, 2021

(65) Prior Publication Data
US 2021/0384291 A1    Dec. 9, 2021

Related U.S. Application Data

(60) Provisional application No. 63/036,526, filed on Jun. 9, 2020.

(51) Int. Cl.
*H01L 23/48*     (2006.01)
*H01L 49/02*     (2006.01)
(Continued)

(52) U.S. Cl.
CPC ............ *H01L 28/10* (2013.01); *H01L 23/481* (2013.01); *H01L 23/49816* (2013.01); *H01L 23/49822* (2013.01); *H01L 23/49838* (2013.01); *H01L 23/5385* (2013.01); *H01L 23/5386* (2013.01); *H01L 24/16* (2013.01); *H01L 25/0657* (2013.01); *H01L 2224/16146* (2013.01); *H01L 2224/16235* (2013.01); *H01L 2225/06513* (2013.01); *H01L 2924/1436* (2013.01);
(Continued)

(58) Field of Classification Search
CPC . H01L 28/10; H01L 23/481; H01L 23/49822; H01L 23/4983; H01L 23/5385; H01L 23/5386
See application file for complete search history.

(56) References Cited

U.S. PATENT DOCUMENTS 10,236,209 B2 *   3/2019   Sharan ................ H01L 23/5223
2010/0187671 A1 *  7/2010   Lin ..................... H01L 21/76898
                                                                                      257/773
(Continued)

FOREIGN PATENT DOCUMENTS

| TW | 201824473 A | 7/2018 |
|----|-------------|--------|
| TW | 201917866 A | 5/2019 |
| TW | 201917899 A | 5/2019 |

OTHER PUBLICATIONS

Partial European Search Report for European Application No. EP 21175025.2 dated Oct. 28, 2021.
(Continued)

*Primary Examiner* — Nicholas J Tobergte
(74) *Attorney, Agent, or Firm* — Wolf, Greenfield & Sacks, P.C.

(57) ABSTRACT

A semiconductor package includes a first die comprising an upper surface and a lower surface opposite to the upper surface. The first die includes a plurality of through-silicon vias (TSVs) penetrating through the first die. A second die is stacked on the upper surface of the first die. An interposer layer is disposed on the lower surface of the first die. An inductor is disposed in the interposer layer. The inductor comprises terminals directly coupled to the TSVs.

21 Claims, 3 Drawing Sheets

(51) Int. Cl.
*H01L 23/498* (2006.01)
*H01L 23/538* (2006.01)
*H01L 23/00* (2006.01)
*H01L 25/065* (2023.01)

(52) U.S. Cl.
CPC .................. *H01L 2924/182* (2013.01); *H01L 2924/19042* (2013.01)

(56) References Cited

U.S. PATENT DOCUMENTS

| | | | | |
|---|---|---|---|---|
| 2011/0278707 | A1* | 11/2011 | Chi | H01L 21/76802 |
| | | | | 257/676 |
| 2012/0119388 | A1* | 5/2012 | Cho | H01L 24/11 |
| | | | | 257/778 |
| 2012/0248569 | A1* | 10/2012 | Jenkins | H01L 23/49822 |
| | | | | 257/E27.026 |
| 2013/0015871 | A1* | 1/2013 | Cleary | G01R 31/2884 |
| | | | | 324/754.03 |
| 2013/0020675 | A1* | 1/2013 | Kireev | H01L 25/0655 |
| | | | | 257/E23.011 |
| 2013/0087884 | A1* | 4/2013 | Bae | H01L 23/147 |
| | | | | 257/531 |
| 2013/0257564 | A1* | 10/2013 | Huang | H01L 23/49827 |
| | | | | 333/177 |
| 2014/0264733 | A1* | 9/2014 | Yuan | H01L 23/5227 |
| | | | | 438/675 |
| 2014/0374875 | A1 | 12/2014 | Yen | |
| 2015/0115405 | A1* | 4/2015 | Wu | H01L 23/5384 |
| | | | | 438/381 |
| 2016/0049385 | A1 | 2/2016 | Yu | |
| 2016/0189980 | A1* | 6/2016 | Paek | H01L 23/49816 |
| | | | | 438/126 |
| 2017/0221858 | A1* | 8/2017 | Yu | H01L 27/0688 |
| 2019/0287956 | A1* | 9/2019 | Raorane | H01L 25/0655 |
| 2020/0279793 | A1* | 9/2020 | Xie | H01L 24/81 |
| 2021/0384291 | A1* | 12/2021 | Zeng | H01L 23/3135 |

OTHER PUBLICATIONS

Extended European Search Report for European Application No. EP 21175025.2 dated Dec. 10, 2021.

* cited by examiner

SEMICONDUCTOR PACKAGE WITH TSV INDUCTOR

CROSS REFERENCE TO RELATED APPLICATIONS

This application claims priority from U.S. provisional application No. 63/036,526 filed on Jun. 9, 2020, the disclosure of which is included in its entirety herein by reference.

BACKGROUND

The present disclosure relates generally to the field of semiconductor technology. More particularly, the present disclosure relates to an improved semiconductor package with high-performance through-silicon via (TSV) inductor.

The implementation of on-chip inductors in integrated circuit application remains a challenge to satisfy the requirements of high quality factor (Q factor), small area consumption, limited parasitic coupling, ease of layout, and manufacture.

Conventionally, additional metal layers of an interconnection structure of a chip or a die are used in the flip chip package fabrication process to improve the Q factor. However, the additional metal layers increase on-die area and fabrication costs, and negatively affect fabrication throughput.

SUMMARY

It is one object of the invention to provide an improved semiconductor package to solve the above-mentioned deficiencies or shortcomings.

According to one aspect of the invention, a semiconductor package includes a first die comprising an upper surface and a lower surface opposite to the upper surface. The first die includes a plurality of through-silicon vias (TSVs) penetrating through the first die. A second die is stacked on the upper surface of the first die. An interposer layer is disposed on the lower surface of the first die. An inductor is disposed in the interposer layer. The inductor comprises terminals directly coupled to the TSVs.

According to some embodiments, the first die is electrically connected to the second die through a conductive pad on the upper surface of the first die and a micro bump.

According to some embodiments, the micro bump extends between a bonding pad of the second die and the conductive pad of the first die.

According to some embodiments, the second die and the upper surface of the first die are encapsulated by a first molding compound.

According to some embodiments, a gap between the second die and the first die is filled with the first molding compound.

According to some embodiments, the first die comprises a die substrate, and wherein the TSVs penetrate through the die substrate.

According to some embodiments, the die substrate comprises a silicon substrate, a silicon-on-insulator substrate, or a silicon germanium substrate.

According to some embodiments, a back-end of line (BEOL) structure is disposed on the die substrate.

According to some embodiments, a back-end of line (BEOL) structure is disposed on the die substrate, and wherein the BEOL structure comprises at least one ultra-low dielectric constant (ultra-low k) layer on the die substrate.

According to some embodiments, the BEOL structure further comprises at least one inter-layer dielectric (ILD) layer on the ultra-low k layer.

According to some embodiments, the ILD layer comprises an un-doped silicate glass layer.

According to some embodiments, at least one metal interconnect layer is formed in the ILD layer, and wherein the metal interconnect layer has a thickness less than 3.0 micrometers.

According to some embodiments, the TSVs penetrate through the die substrate and at least the ultra-low k layer, and wherein the TSVs are electrically connected to the metal interconnect layer in ILD layer.

According to some embodiments, the TSVs are connected to connecting pads of the interposer layer.

According to some embodiments, the connecting pads are connected to an inductor formed from a metal trace in the interposer layer, and wherein the metal trace has a thickness that is equal to or greater than 3.0 micrometers.

According to some embodiments, the inductor is disposed in a horizontal level of the interposer layer under the lower surface of the first die.

According to some embodiments, the inductor is disposed directly under the first die.

According to some embodiments, the first die, the first molding compound, and an upper surface of the interposer layer are encapsulated by a second molding compound.

According to some embodiments, the semiconductor package further comprises: a re-distribution layer on the second molding compound and the second die; a semiconductor package may be mounted on the re-distribution layer; and a plurality of through molding vias in the second molding compound. The semiconductor package is electrically coupled to the interposer layer through the through molding vias.

According to some embodiments, the semiconductor package comprises a DRAM package.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

Figure 1:
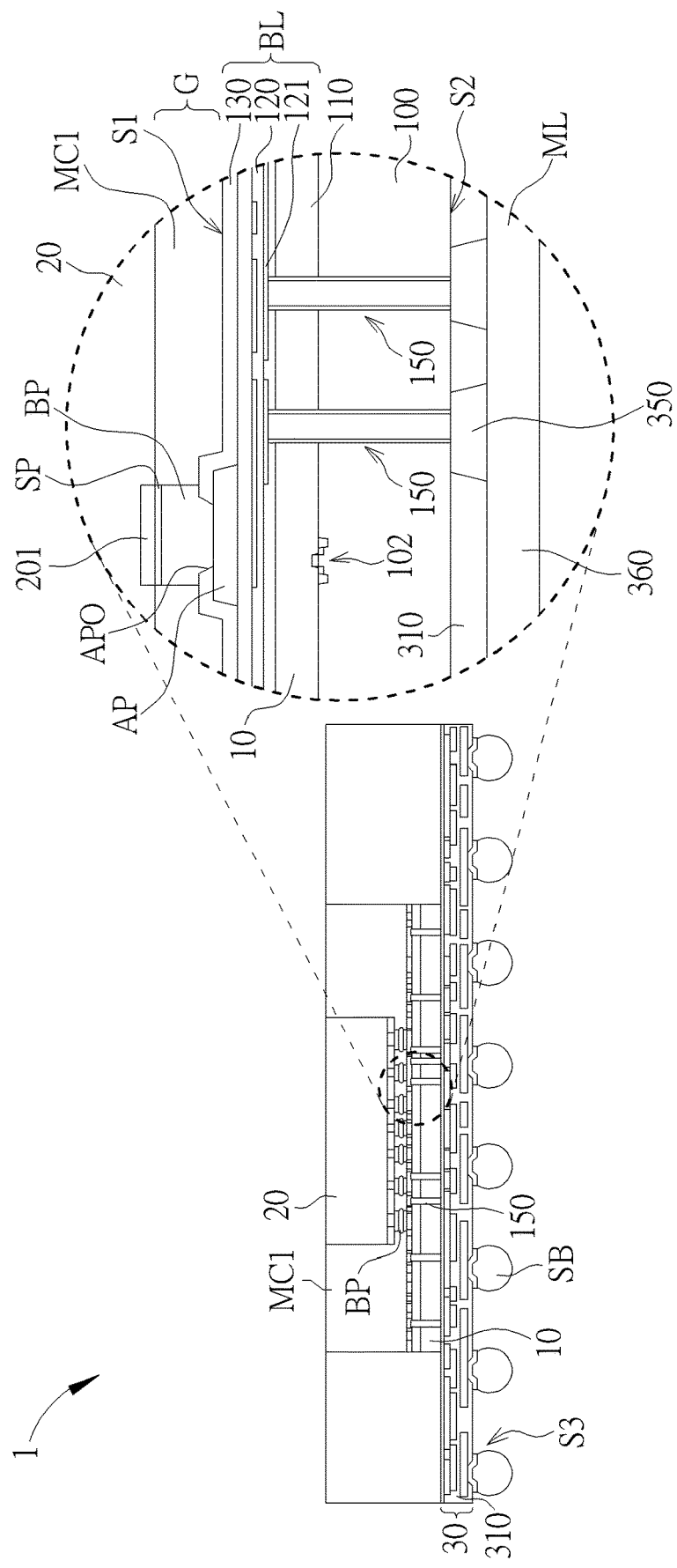
FIG. 1 is a schematic, cross-sectional diagram showing a stacked die package according to one embodiment of the invention.

In the following detailed description of embodiments of the invention, reference is made to the accompanying drawings, which form a part hereof, and in which is shown by way of illustration specific preferred embodiments in which the disclosure may be practiced. These embodiments are described in sufficient detail to enable those skilled in the art to practice them, and it is to be understood that other embodiments may be utilized and that mechanical, structural, and procedural changes may be made without departing from the spirit and scope of the present disclosure. The following detailed description is, therefore, not to be taken in a limiting sense, and the scope of embodiments of the present invention is defined only by the appended claims.

It will be understood that, although the terms first, second, third, primary, secondary, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first or primary element, component, region, layer or section discussed below could be termed a second or secondary element, component, region, layer or section without departing from the teachings of the present inventive concept.

Spatially relative terms, such as "beneath", "below", "lower", "under", "above," "upper," "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" or "over" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

It is noted that: (i) same features throughout the drawing figures will be denoted by the same reference label and are not necessarily described in detail in every drawing that they appear in, and (ii) a sequence of drawings may show different aspects of a single item, each aspect associated with various reference labels that may appear throughout the sequence, or may appear only in selected drawings of the sequence.

The present invention pertains to a stacked die package comprising a first die and a second die stacked on the first die. The proposed inductor is designed to be placed at the backside of the first die in a fan-out interposer layer for efficiently utilizing the silicon area and can be connected to the front side circuits of the lower die through TSVs.

Please refer to FIG. 1. FIG. 1 is a schematic, cross-sectional diagram showing a stacked die package 1 according to one embodiment of the invention. As shown in FIG. 1, the stacked die package 1 comprises a first die 10 and a second die 20 stacked on the first die 10. According to one embodiment, the first die 10 and the second die 20 are performed as different functions and manufactured by different process node technology, for example, the first die 10 may be a modem die manufactured by 5 nm process and the second die 20 may be a processor die manufactured by 3 nm process, but not limited thereto. As can be seen in the circle region on the right showing an enlarged view of a portion of the stacked die package 1, the first die 10 has an upper surface S1 and a lower surface S2 opposite to the upper surface S1. The second die 20 is mounted on the upper surface S1.

The first die 10 may be electrically connected to the second die 20 through a conductive pad AP on the upper surface S1 of the first die 10 and a micro bump BP. The micro bump BP extends between a bonding pad 201 of the second die 20 and the conductive pad AP of the first die 10. According to some embodiments, a solder layer SP may be further provided between the bonding pad 201 and the conductive pad AP, but is not limited thereto. In some embodiment, the conductive pad AP may be made of aluminum, but is not limited thereto. A gap G between the second die 20 and the first die 10 may be filled with a sealant or a molding compound MC1, but is not limited thereto.

The first die 10 includes a die substrate 100. The die substrate 100 may be a semiconductor substrate, for example, a silicon substrate. It is to be understood that other types of semiconductor substrates may be used. For example, in some embodiments, the die substrate 100 may be a silicon-on-insulator, silicon germanium or other types of semiconductor substrates. Circuit components 102 may be formed on or in the die substrate 100. For example, the circuit components 102 may include a transistor having a gate and source/drain regions.

A back-end of line (BEOL) structure BL is disposed on the die substrate 100. According to one embodiment, for example, the BEOL structure BL comprises at least one ultra-low dielectric constant (ultra-low k) layer 110 formed on the die substrate 100. According to one embodiment, for example, the ultra-low k layer 110 may have a dielectric constant that is smaller than 2.6, for example, 2.55, but is not limited thereto. The BEOL structure BL may further comprise at least one inter-layer dielectric (ILD) layer 120 such as an un-doped silicate glass (USG) layer formed on the ultra-low k layer 110. According to one embodiment, for example, the ILD layer 120 may have a dielectric constant that is about 3.3, but is not limited thereto. At least one metal interconnect layer 121 may be formed in the ILD layer 120. For example, the metal interconnect layer 121 may have a thickness of about 2.8 micrometers. For example, the metal interconnect layer 121 may have a thickness less than 2.8 micrometers. For example, the metal interconnect layer 121 may have a thickness of less than 3.0 micrometers. The conductive pad AP may be formed on the ILD layer 120. A passivation layer 130 such as a silicon nitride layer may be formed on the ILD layer 120. An opening APO may be provided in the passivation layer 130 to partially expose the conductive pad AP. The micro bump BP may be formed on the conductive pad AP through the opening APO.

According to one embodiment, the first die 10 further comprises a plurality of through silicon vias (TSVs) 150. The TSVs 150 penetrate through the die substrate 100 and at least the ultra-low k layer 110. The TSV 150 may be electrically connected to the metal interconnect layer 121 in ILD layer 120. The other end of each of the TSV 150 may be connected to a connecting pad 350 of a fan-out interposer layer (or a re-distribution layer) 30 disposed on the lower surface S2 of the first die 10. According to one embodiment, the connecting pad 350 may be further connected to an inductor 360 formed from a metal trace ML in the fan-out interposer layer 30. For example, the inductor 360 is disposed in a horizontal level of the fan-out interposer layer 30 under the lower surface S2 of the first die 10. The dielectric layer 310 of the fan-out interposer layer 30 separates the inductor 360 from the die substrate 100. In some embodiments, the dielectric layer 310 is made of polymer material.

Figure 2:
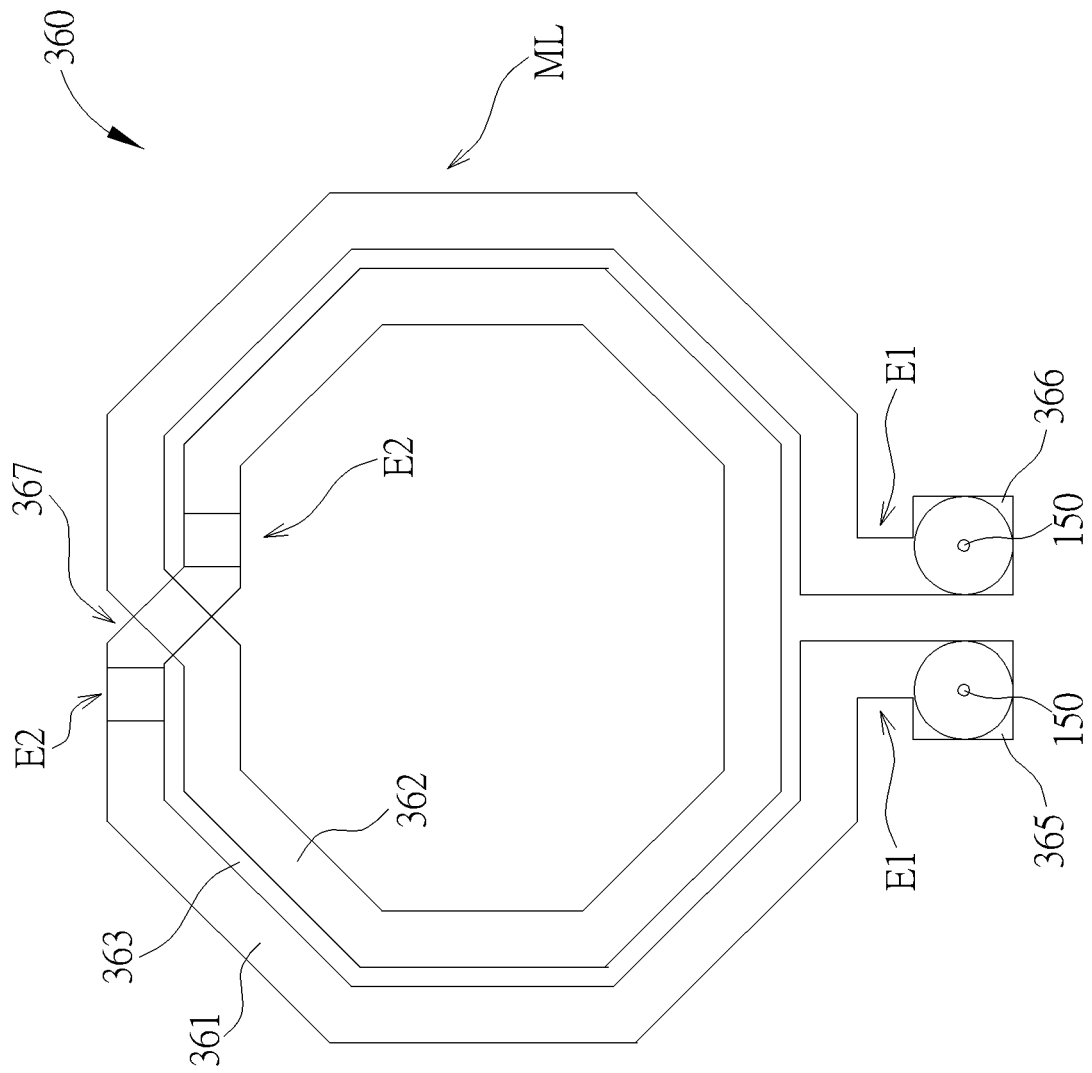
FIG. 2 shows a top view of an embodiment of an inductor.

FIG. 2 shows a top view of an exemplary inductor. The inductor 360, for example, includes metal trace ML forming first and second concentric loops. According to one embodiment, the metal trace ML has a thickness that is equal to or greater than 3.0 micrometers. The loops include the geometric shape of an inductor circuit. The loops which including at least one outer segment 361 and at least one inner segment 362 are separated by an inter-loop spacing 363. The inductor 360 includes first and second terminals 365 and 366. The first and second terminals 365 and 366 of the inductor 360 are coupled to first ends E1 of the outer segment 361. The second end E2 of the outer segment 361 is coupled to second end E2 of the inner segment 362 via a cross-over coupling 367. The cross-over coupling 367, for example, is provided on a second plane horizontal level of the fan-out interposer layer 30, which is different than first horizontal level where the loops of the inductor 360 are formed. The first and second terminals 365 and 366 are directly connected to the corresponding TSVs 150.

The inductor 360, as described above, is for purpose of illustration and should not be limited thereto. The inductor 360 may include other suitable types of configurations. For example, the inductor 360 may be formed on multiple metal levels.

As shown in FIG. 1, the fan-out interposer layer (or re-distribution layer) 30 may be used to fan out the terminals of the first die 10 on the second surface S2 from a tighter pitch to a looser pitch. On the lower surface S3 of the fan-out interposer layer 30, a plurality of solder balls SB may be provided for further connection. The first die 10 and the second die 20 may be encapsulated by a molding compound MC2. The first die 10, the molding compound MC1, and an upper surface of the fan-out interposer layer 30 are encapsulated by the molding compound MC2. The bottom surface of the molding compound MC2 may be approximately flush with the lower surface S2 of the first die 10. The fan-out interposer layer 30 is disposed on the bottom surface of the molding compound MC2 and on the lower surface S2 of the first die 10. The lower ends of the TSVs 150 of the first die 10 are electrically connected to the metal layers of the fan-out interposer layer 30. Preferably, the inductor 360 is disposed directly under the first die 10 as to develop a shorter electrical path between the inductor 360 and the first die 10 and will provide a better chip performance. It is to be understood that the inductor 360 may be partially overlapped with the first die 10 in some embodiments so as to achieve a shorter electrical path between the first die 10 and the inductor 360.

Figure 3:
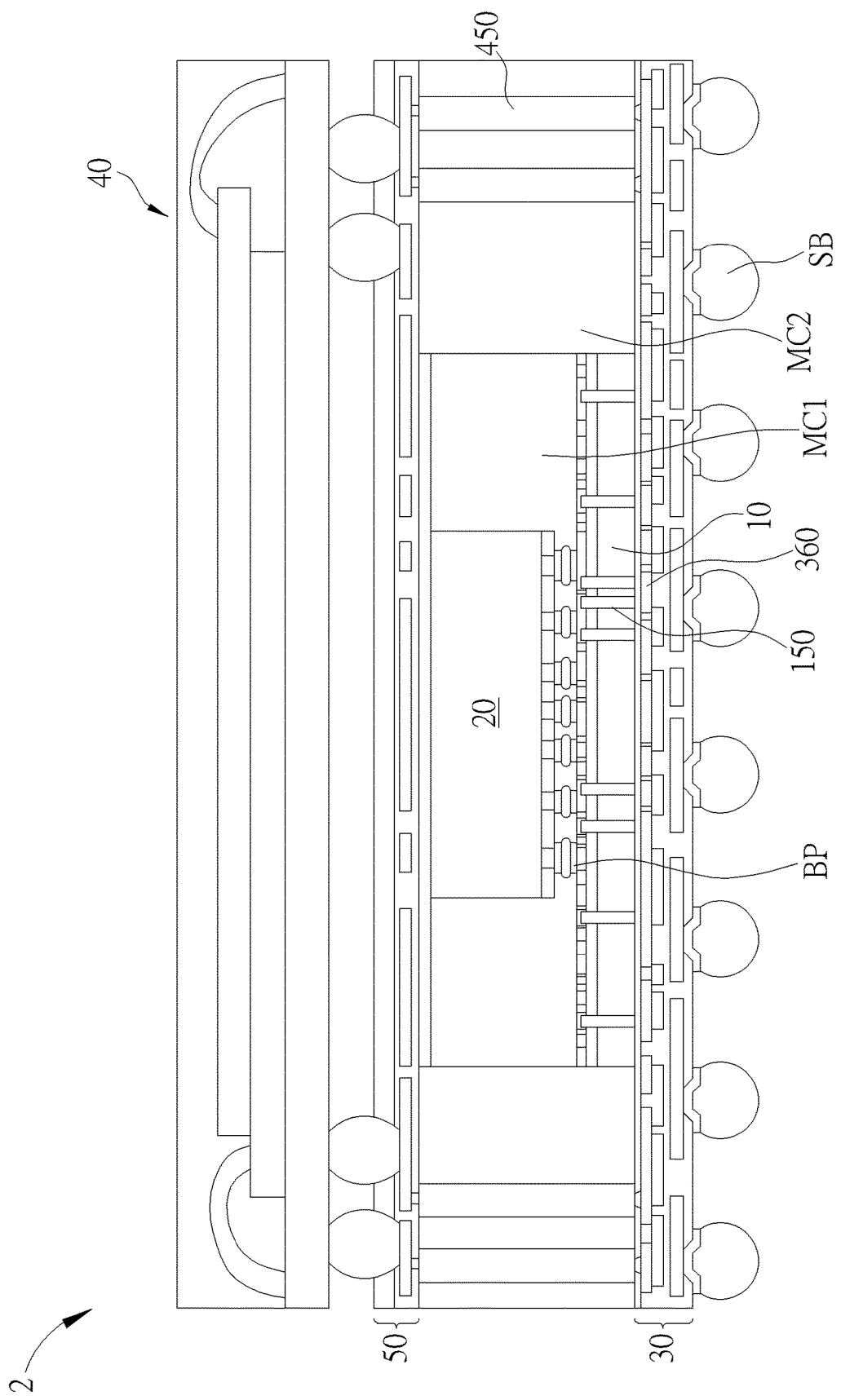
FIG. 3 is a schematic, cross-sectional diagram showing a stacked die package according to another embodiment of the invention.

Please refer to FIG. 3. FIG. 3 is a schematic, cross-sectional diagram showing a stacked die package 2 according to another embodiment of the invention, wherein like elements, regions or layers are designated by like numeral numbers or labels. Likewise, as shown in FIG. 3, the stacked die package 2 comprises a first die 10 and a second die 20 stacked on the first die 10. The first die 10 may be electrically connected to the second die 20 through micro bumps BP. The inductor 360 is disposed in the fan-out interposer layer 30 under the first die 10. The terminals of the inductor 360 are directly coupled to the corresponding TSVs 150 that penetrate through the first die 10. The stacked die package 2 further comprises a re-distribution layer 50 on the molding compound MC2 and the second die 20. A semiconductor package 40 such as a memory package or DRAM package may be mounted on the re-distribution layer 50. The semiconductor package 40 may be electrically coupled to the fan-out interposer layer 30 through the through molding vias (TMVs) 450.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a first die, comprising:
      an upper surface and a lower surface opposite to the upper surface;
      a plurality of through-silicon vias (TSVs) penetrating through the first die; and
      circuit components including a transistor having gate and source/drain regions;
   a second die stacked on the upper surface of the first die;
   an interposer comprising an interposer layer disposed adjacent to the lower surface of the first die; and
   an inductor disposed in the interposer layer, wherein the inductor comprises terminals directly coupled to the TSVs.

2. The semiconductor package according to claim 1, wherein the first die is electrically connected to the second die through a conductive pad on the upper surface of the first die and a micro bump.

3. The semiconductor package according to claim 2, wherein the micro bump extends between a bonding pad of the second die and the conductive pad of the first die.

4. The semiconductor package according to claim 1, wherein the second die and the upper surface of the first die are encapsulated by a first molding compound.

5. The semiconductor package according to claim 4, wherein a gap between the second die and the first die is filled with the first molding compound.

6. The semiconductor package according to claim 1, wherein the first die comprises a die substrate, and wherein the TSVs penetrate through the die substrate.

7. The semiconductor package according to claim 6, wherein the die substrate comprises a silicon substrate, a silicon-on-insulator substrate, or a silicon germanium substrate.

8. The semiconductor package according to claim 6, wherein a back-end of line (BEOL) structure is disposed on the die substrate.

9. The semiconductor package according to claim 6, wherein a back-end of line (BEOL) structure is disposed on the die substrate, and wherein the BEOL structure comprises at least one ultra-low dielectric constant (ultra-low k) layer on the die substrate.

10. The semiconductor package according to claim 9, wherein the BEOL structure further comprises at least one inter-layer dielectric (ILD) layer on the at least one ultra-low k layer.

11. The semiconductor package according to claim 10, wherein the ILD layer comprises an un-doped silicate glass layer.

12. The semiconductor package according to claim 10, wherein at least one metal interconnect layer is formed in the ILD layer, and wherein the at least one metal interconnect layer has a thickness less than 3.0 micrometers.

13. The semiconductor package according to claim 12, wherein the TSVs penetrate through the die substrate and at least the at least one ultra-low k layer, and wherein the TSVs are electrically connected to the at least one metal interconnect layer in ILD layer.

14. The semiconductor package according to claim 1, wherein the TSVs are connected to a plurality of connecting pads of the interposer layer.

15. The semiconductor package according to claim 14, wherein the plurality of connecting pads are connected to the inductor, wherein the inductor is formed from a metal trace in the interposer layer, and wherein the metal trace has a thickness that is equal to or greater than 3.0 micrometers.

16. The semiconductor package according to claim 1, wherein the inductor is disposed in a horizontal level of the interposer layer under the lower surface of the first die.

17. The semiconductor package according to claim 1, wherein the inductor is disposed directly under the first die.

18. The semiconductor package according to claim 1, wherein the inductor is disposed partially overlapped with the first die.

19. A semiconductor package, comprising:
  a first die comprising an upper surface and a lower surface opposite to the upper surface, wherein the first die comprises a plurality of through-silicon vias (TSVs) penetrating through the first die;
  a second die stacked on the upper surface of the first die, wherein the second die and the upper surface of the first die are encapsulated by a first molding compound;
  an interposer layer disposed on the lower surface of the first die, wherein the first die, the first molding compound, and an upper surface of the interposer layer are encapsulated by a second molding compound; and
  an inductor disposed in the interposer layer, wherein the inductor comprises terminals directly coupled to the TSVs.

20. The semiconductor package according to claim 19 further comprising:
  a re-distribution layer on the second molding compound and the second die;
  a second semiconductor package mounted on the re-distribution layer; and
  a plurality of through molding vias in the second molding compound, wherein the second semiconductor package is electrically coupled to the interposer layer through the plurality of through molding vias.

21. The semiconductor package according to claim 20, wherein the second semiconductor package comprises a DRAM package.

\* \* \* \* \*